United States Patent [19]
Moane

[11] Patent Number: 5,966,041
[45] Date of Patent: Oct. 12, 1999

[54] HIGH SWING INTERFACE OUTPUT STAGE INTEGRATED CIRCUIT FOR INTERFACING A DEVICE WITH A DATA BUS

[75] Inventor: Brian Anthony Moane, Ballykeeffe, Ireland

[73] Assignee: Analog Devices, Inc., Norwood, Mass.

[21] Appl. No.: 08/961,354

[22] Filed: Oct. 30, 1997

[51] Int. Cl.[6] .................................................. H03K 17/62
[52] U.S. Cl. .......................... 327/417; 327/378; 327/432; 327/538; 326/80; 326/81
[58] Field of Search ..................................... 327/378, 417, 327/432, 538; 326/80, 81

[56] References Cited

U.S. PATENT DOCUMENTS

| | | | |
|---|---|---|---|
| 5,592,142 | 1/1997 | Adams et al. | 340/146.2 |
| 5,804,861 | 9/1998 | Leach | 257/362 |

Primary Examiner—Margaret R. Wambach
Attorney, Agent, or Firm—Wolf, Greenfield & Sacks, P.C.

[57] ABSTRACT

A high swing interface output stage integrated circuit for interfacing a data communications device with a data bus which may operate at voltage ranges outside the supply voltage of the interface circuit. An output terminal of the integrated circuit is coupled to a positive supply rail of the circuit through a substrate NPN transistor, and to a ground rail through first and second NMOS FETS. A third MOS FET also formed is coupled between the common connection of the first and second NMOS FETS and the gate of the second NMOS FET for holding the second NMOS FET off in the event of the voltage on the output terminal being driven below the ground voltage of the circuit. Other NMOS and PMOS FETS in the circuit control the operation of the circuit for determining the high and low states of the voltage on the output terminal. The interface circuit presents either a high impedance or a current limiting impedance to the output terminal in the event of the output terminal voltage being driven outside the supply voltage of the circuit.

21 Claims, 3 Drawing Sheets

HIGH SWING INTERFACE OUTPUT STAGE INTEGRATED CIRCUIT FOR INTERFACING A DEVICE WITH A DATA BUS

BACKGROUND TO THE INVENTION

1. Field of the Invention

The present invention relates to a high swing interface output stage integrated circuit for interfacing a device with a data bus which operates at voltages outside the power supply voltage of the interface circuit and which may be shared by other devices which may operate at power supply voltages outside the power supply voltage of the interface circuit. The invention also relates to a method for providing such a high swing interface output stage integrated circuit.

2. Prior Art

Output stage interface circuits for interfacing devices namely, data communications devices, for example, computers with a data bus operating under transmission standards such as RS485, RS422, R5232 and CANbus are known. Such standards operate at a relatively wide range of output terminal voltages; for example, RF485, specifics operation, at an output terminal voltage up to +12 volts and down as low as −7 volts, and indeed some transmission standards operate at voltage ranges greater than these.

Figure 1:
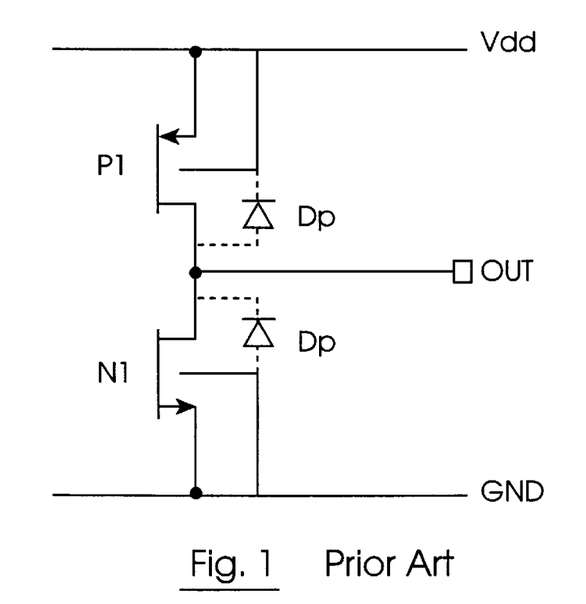
FIG. 1 is a circuit diagram illustrating a conventional prior art interface output stage integrated circuit.

A conventional interface circuit for interfacing a device with a data bus comprises a CMOS circuit, of the type illustrated in FIG. 1. Supply rails $V_{dd}$ and GND of the interface circuit of FIG. 1 are connected to a bus output terminal OUT through a PMOS FET P1 and an NMOS FET N1, respectively. Input signals on the gates of the MOS FETS P1 and P2 alternately operate the MOS FETS for determining the respective high and low states of the output terminal OUT in response to high and low states of input signals. While such an interface circuit is adequate for interfacing a device with a data bus provided the data bus is operating at an output terminal voltage within the power supply voltage $V_{dd}$ of the interface circuit, these interface circuits are unsuitable where the output terminal voltage of the data bus is outside the supply voltage of the interface circuit. On the output terminal voltage of the interface circuit being driven outside the supply voltage, the source and drain of the relevant MOS FET P1 or N1 reverse, and a parasitic diode Dp between the well and the drain of that MOS FET P1 or N1, provides a conductive path through the MOS FET P1 or N1 between the output terminal OUT and the corresponding supply rail $V_{DD}$ or GND. This causes either sinking of current from the data bus into the interface circuit, or sourcing of current from the interface circuit into the data bus, either of which causes corruption of data on the data bus, and may cause damage to the interface circuit.

Since many data communications devices, in particular, laptop computers operate at relatively low voltage power supplies, for example, at or below 5 volts, and in many cases, as low as 3 volts, there is a need for an interface output stage for interfacing such low voltage devices with a data bus operating at output terminal voltages well outside the range of the power supply of the low voltage device. Additionally, since many transmission standards require a relatively high differential output swing voltage, such an interface output stage integrated circuit must also be capable of providing a relatively high differential output swing voltage, even when operating at relatively low voltages, such as 3 volts. The transmission standard RS485 requires a differential output voltage of 1.5 volts to be developed across a differential load resistor of 54 ohms, while the RS422 transmission standard requires an output terminal voltage of 2 volts (single-ended) developed across a load resistor of 100 ohms.

U.S. Pat. No. 5,414,314 discloses an interface output stage integrated circuit which while operating at a relatively low supply voltage, can develop a relatively high swing output terminal voltage. The circuit of the prior art U.S. specification also presents a high impedance to the output terminal in the event of the output terminal being driven to a voltage outside the supply voltage of the circuit when the circuit is powered and not active. The circuit of U.S. Pat. No. 5,414,314 achieves this by having three P channel devices, namely, three PMOS FETS formed in a common well on the substrate of the integrated circuit, and three N channel devices, namely, three NMOS FETS formed in another common well on the substrate. Two of the PMOS FETS and two of the NMOS FETS are coupled in series between the output terminal and the supply voltage rail and the ground rail, respectively, of the output stage. The third NMOS FET and the third PMOS FET are coupled between the common connection of the other two corresponding first and second FETS and the gates of the second corresponding FETS. The common connection of each set of three FETS is connected to the corresponding common well of the three FETS. The third FETS hold the second FETS off in the event of the output terminal voltage being driven above or below the voltages on the supply and ground rails when the circuit is powered up and inactive, for providing high impedance between the output terminal and the respective supply and ground rails.

While the circuit of U.S. Pat. No. 5,414,314 permits the output terminal to be driven by the bus to a voltage above or below the supply voltage of the output stage when the output stage is powered up and inactive, it suffers from a number of disadvantages. Firstly, it is formed by a CMOS process, which needless to say, increases the number of process steps in the fabrication of the integrated circuit. Secondly, the circuit of the U.S. prior art specification tends to be temperature dependent. The differential output voltage of the circuit falls off relatively rapidly with a rise in temperature of the output stage. Thus, in order to meet a particular differential output voltage at high temperatures, the PMOS and NMOS FETS of the prior art circuit must be of relatively large size. This requires the provision of a relatively expensive die, and furthermore, the large size FETS are redundant at lower temperatures. This is a significant disadvantage.

There is therefore a need for an interface output stage integrated circuit for interfacing a device with a data bus, which is suitable for operating at a relatively low supply voltage, and is capable of developing a relatively high swing output voltage. The interface circuit should prevent excessive sinking of current from the data bus, or excessive sourcing of current from the circuit to the data bus in the event of the output terminal being driven to a voltage outside the supply voltage of the circuit. Additionally, the interface circuit should overcome the problems of known prior art devices, and in particular the number of processing steps required in the fabrication of the integrated circuit should be minimised, and the interface circuit should be relatively temperature independent, and should be relatively inexpensive to fabricate.

SUMMARY OF THE INVENTION

According to the invention there is provided a high swing interface output stage integrated circuit for interfacing a device with a shared bus, the circuit comprising:

a bipolar junction transistor coupled between a first supply rail and an output terminal of the circuit, first, second and third field effect transistors of Pwell or Nwell type corresponding to the P or N type of the base of the bipolar junction transistor, respectively the first and second field effect transistors being coupled in series between the output terminal and a second supply rail of the circuit, the second field effect transistor being coupled to the second supply rail, the third field effect transistor being coupled between the common connection of the first and second field effect transistors and the gate of the second field effect transistor for holding the second field effect transistor off when the polarity of the voltage across the source and drain of the second field effect transistor is reversed, from that normally established by voltages sourced to the first and second supply rails the common connection of the first, second and third field effect transistors being connected to the well or wells of the respective first, second and third field effect transistors, and a control means for controlling the third field effect transistor for holding the second field effect transistor on when the circuit is powered up and active so that the bipolar junction transistor and the first field effect transistor can be controlled for determining the high and low states of the output terminal, and for controlling when the circuit is powered down or powered up and active or inactive; the third field effect transistor for holding the second field effect transistor off for presenting a high impedance between the output terminal and the second supply rail in response to the voltage on the output terminal being driven outside the supply voltage on the first and second rails in the direction of the second rail, the bipolar junction transistor, the first and second field effect transistors and the control circuit being adapted so that when the circuit is powered up and active the bipolar junction transistor forms one of a high impedance or a current limiting impedance between the output terminal and the first supply rail when the voltage on the output terminal is driven outside the supply voltage on the first and second rails in the direction of the second rail, and the first field effect transistor forms a current limiting impedance between the output terminal and the second supply rail when the voltage on the output terminal is driven outside the supply voltage on the first and second rails in the direction of the first rail.

In one embodiment of the invention the control means selectively holds the bipolar junction transistor on in response to a first input signal being in one of high and low states, and the control means also selectively holds the first field effect transistor on in response to a second input signal being in one of high and low states.

Preferably, the control means selectively holds one of the bipolar junction transistor and the first field effect transistor on, and the other off in response to the first and second input signals being in the same one of the high and low states for determining one of the high and low states of the output terminal when the circuit is powered up and active.

In one embodiment of the invention the third field effect transistor is responsive to a third input signal being in one of high and low states for holding the third field effect transistor on for in turn holding the second field effect transistor off.

In one embodiment of the invention the control means comprises a first switch means coupled between the first rail and the gate of the second field effect transistor, the first switch means being responsive to the third input signal for holding the first switch means on for in turn holding the second field effect transistor on, when the third input signal is in the one of the high and low states for holding the third field effect transistor off.

Preferably, the first switch means comprises a fourth field effect transistor of Pwell or Nwell type different from the P or N type of the base of the bipolar junction transistor, respectively the third input signal being applied to the gate of the fourth field effect transistor.

In another embodiment of the invention the control means comprises a second switch means for coupling the base of the bipolar junction transistor to the first rail, and a third switch means for coupling the base of the bipolar junction transistor to the second rail, the second and the third switch means being responsive to the first input signal for selectively holding the bipolar junction transistor on and off in response to the respective states of the first input signal, the third switch means being responsive to the third input signal for holding the bipolar junction transistor off when the third input signal is in the one of the high and low states for holding the third field effect transistor off, the second switch means being adapted for providing a current limiting impedance in the event of the second switch means and the bipolar junction transistor being on when the voltage on the output terminal is driven outside the supply voltage in the direction of the second rail.

Preferably, the second switch means comprises a fifth field effect transistor of Pwell or Nwell type different to the P or N type of the base of the bipolar junction transistor, respectively the fifth field effect transistor being responsive to one of the high and low states of the first input signal for connecting the base of the bipolar junction transistor to the first rail for holding the bipolar junction transistor on.

Advantageously, the third switch means comprises sixth, seventh and eighth field effect transistors of a Pwell or Nwell type corresponding to that of the P or N type of the base of the bipolar junction transistor, respectively the sixth and seventh field effect transistors being coupled in series between the base of the bipolar junction transistor and the second rail, the seventh field effect transistor being coupled to the second rail, the eighth field effect transistor being coupled between the common connection of the sixth and seventh field effect transistors, and the gate of the seventh field effect transistor for holding the seventh field effect transistor off when the polarity of the voltage across the source and drain of the seventh transistor are reversed from that normally established by voltages sourced through the first and second supply rails to establish a supply voltage range by the voltage on the base of the bipolar junction transistor being pulled outside the supply voltage range in the direction of the second rail, the common connection of the sixth, seventh and eighth field effect transistors being connected to the well or wells of the respective sixth, seventh and eighth field effect transistors, the sixth field effect transistor being responsive to one of the high and low states of the first input signal for connecting the base of the bipolar junction transistor to the second rail when the seventh field effect transistor is held on for holding the bipolar junction transistor off.

Ideally, the eighth field effect transistor is responsive to the third input signal for holding the seventh field effect transistor off, when the third input signal is in the one of the high and low states for holding the third field effect transistor on.

In a further embodiment of the invention the control means comprises a fourth switch means coupled between the first rail and the gate of the seventh field effect transistor for holding the seventh field effect transistor on when the circuit is powered up and active, the fourth switch means being responsive to the third input signal for holding the seventh field effect transistor on, when the third input signal is in the one of the high and low states for holding the third field effect transistor off.

Preferably, the fourth switch means comprises a ninth field effect transistor of Pwell or Nwell type different to the P or N type of the base of the bipolar junction transistor, respectively the third input signal being applied to the gate of the ninth field effect transistor.

Ideally, the control means comprises a monitoring means for monitoring the voltage on the output terminal, the control means being responsive to the monitoring means for operating the third field effect transistor for holding the second field effect transistor off before the voltage on the output terminal is driven outside the supply voltage in the direction of the second rail to a level which would turn on a drain to well parasitic diode of the first or second field effect transistors.

Ideally, the bipolar junction transistor is a substrate transistor, the collector of which is formed by the substrate.

Advantageously, the base of the bipolar junction transistor is formed by the integrated circuit substrate and the well of each field effect transistor is a semiconductor type opposite to that of the P or N type of the substrate.

In one embodiment of the invention the bipolar junction transistor is an NPN transistor, and the first rail is at a voltage higher than the voltage on the second rail.

Ideally, the bipolar junction transistor and the field effect transistors which are of the same Pwell or Nwell type as the P or N type of the base of the bipolar junction transistor are formed simultaneously during the same Pwell or Nwell well diffusion process.

Preferably, the breakdown voltage of the field effect transistors of the integrated circuit is chosen to exceed the extremes of the voltages across their source and drain path which would result when the output terminal voltage to which the circuit is to be connected reaches its expected extremes and the supply voltage of the circuit.

Additionally, the invention provides a device for communicating a data communication device with a data bus, the device comprising the high swing interface output stage integrated circuit according to the invention.

Further, the invention provides a method for providing a high swing interface output stage integrated circuit for interfacing a device with a data bus, wherein other devices on the data bus may operate at supply voltages outside the supply voltage of the interface circuit, the method comprising the steps of providing a bipolar junction transistor coupled between a first supply rail and an output terminal of the circuit, providing first, second and third field effect transistors of Pwell or Nwell type similar to the P or N type of the base of the bipolar junction transistor, respectively the first and second field effect transistors being coupled in series between the output terminal and a second supply rail of the circuit, the second field effect transistor being coupled to the second supply rail, the third field effect transistor being coupled between the common connection of the first and second field effect transistors and the gate of the second field effect transistor for holding the second field effect transistor off when the source and drain of the second field effect transistor are reversed, the common connection of the first, second and third field effect transistors being connected to the well or wells of the respective first, second and third field effect transistors, and controlling the third field effect transistor for holding the second field effect transistor on when the circuit is powered up and active so that the bipolar junction transistor and the first field effect transistor can be controlled for determining the high and low states of the output terminal, and for controlling, when the circuit is powered down or powered up and active or inactive the third field effect transistor for holding the second field effect transistor off to present a high impedance between the output terminal and the second supply rail in response to the voltage on the output terminal being driven outside the supply voltage on the first and second rails in the direction of the second rail, and adapting the bipolar junction transistor, the first and second field effect transistors and the control circuit so that when the circuit is powered up and active the bipolar junction transistor forms one of a high impedance or a current limiting impedance between the output terminal and the first supply rail when the voltage on the output terminal is driven outside the supply voltage on the first and second rails in the direction of the second rail, and so that the first field effect transistor forms a current limiting impedance between the output terminal and the second supply rail when the voltage on the output terminal is driven outside the supply voltage on the first and second rails in the direction of the first rail.

Ideally, in response to a first input signal being in one of high and low states, the bipolar junction transistor is selectively held on, and also in response to a second input signal being in one of high and low states, the first field effect transistor is selectively held on.

The invention will be more clearly understood from the following description of a preferred embodiment thereof, which is given by way of example only with reference to the accompanying drawings.

DETAILED DESCRIPTION

Figure 2:
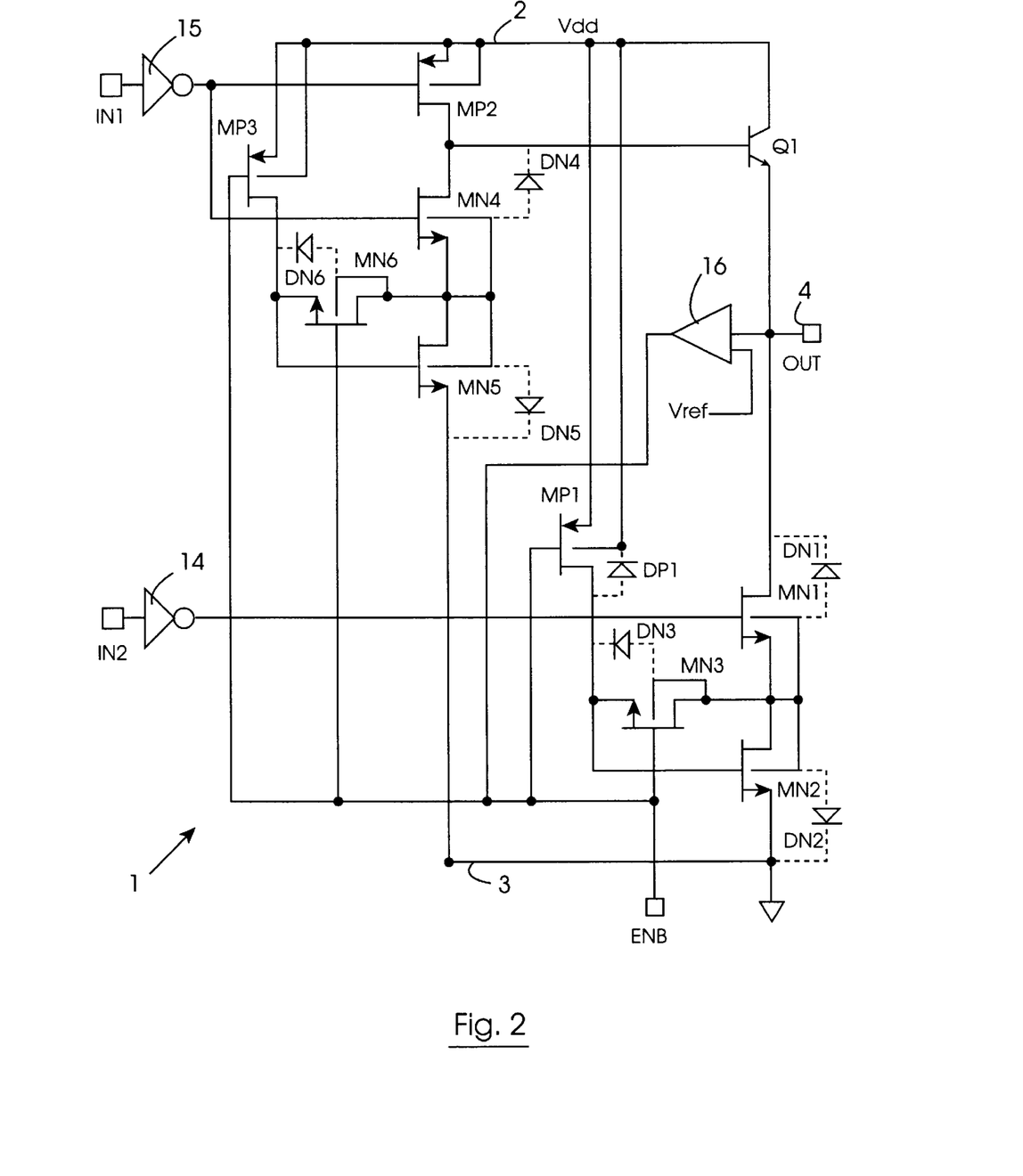
FIG. 2 is a circuit diagram of a high swing interface output stage integrated circuit according to the invention.

Referring to the drawings and initially to FIG. 2 there is illustrated an exemplary embodiment of a high swing interface output stage integrated circuit according to the invention, which is indicated generally by the reference numeral 1 for interfacing a device (not shown), but typically, a data communications device, such as a computer with a data bus (also not shown). The data bus may be shared with other devices, and the data bus and/or the other devices may operate at output terminal voltages outside the supply voltage of the interface circuit 1. In this embodiment of the invention, the circuit 1 is suitable for interfacing with data buses operating under a number of different transmission standards, including but not limited to the transmission standards RS485, RS422, RS232 and CANbus.

Figure 3:
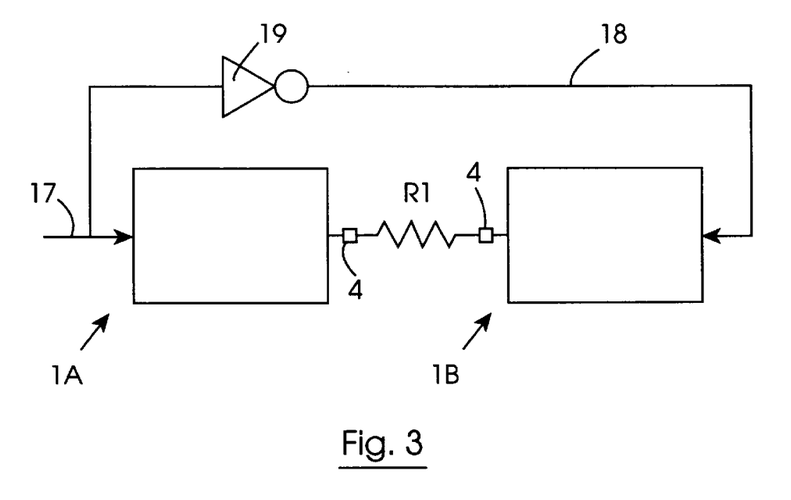
FIG. 3 is a diagrammatic transverse cross-sectional view of a portion of the integrated circuit of FIG. 2.

The circuit 1 comprises a first supply rail 2 on which a positive supply voltage $V_{dd}$ is applied, and a second supply rail 3 which is held at ground. The supply voltage $V_{dd}$ can be as low as 2.7 volts, and typically is 3 volts. An output terminal 4 couples the circuit 1 to the data bus. A high swing output voltage is developed on the output terminal 4, which may be developed across a load resistor, or in the case of the RS485 transmission standard, may be a differential output voltage developed across a differential load resistor R1, which typically, is 54 ohms. To develop a differential voltage across the differential load resistor R1, two circuits 1 are required, namely, circuits 1A and 1B, as illustrated in FIG. 3, and the differential load resistor R1 is connected to the output terminals 4 of the respective circuits 1A and 1B.

The circuit 1 is controlled by three input signals, namely, a first input signal which is applied to a first input terminal IN1, a second input signal which is applied to a second input terminal IN2, and a third input signal which is applied to an enabling terminal ENB. The first, second and third input signals are derived from the data signal which is to be applied to the data bus. The derivation of the first, second and third input signals from the data signal will be well known to those skilled in the art. The circuit is disabled when the first input signal is in its low state and the second and third input signals are each in their high states. The circuit is active when the third input signal is in its low state, and the first and second input signals are in their high or low states but both are in the same state. The output terminal 4 is driven to its high state when the first and second input signals are in their high states, and vice versa when the first and second input signals are in their low states.

As will be described below, the circuit 1 presents a high impedance to the output terminal 4 when the circuit 1 is powered down or powered up and inactive in the event of the voltage on the output terminal 4 being driven above the supply voltage on the first rail 2 or below the ground voltage on the second rail 3. The circuit 1 presents either a high impedance or a current limiting impedance to the output terminal 4 when the circuit 1 is powered up and active in the event of the voltage on the output terminal being driven above the supply voltage on the first rail 2 or below the ground voltage on the second rail 3. Thus, the circuit 1 prevents sinking excessive current from or sourcing excessive current to the data bus, in the event of the output terminal voltage of the circuit 1 being driven outside the supply voltage.

Figure 4:
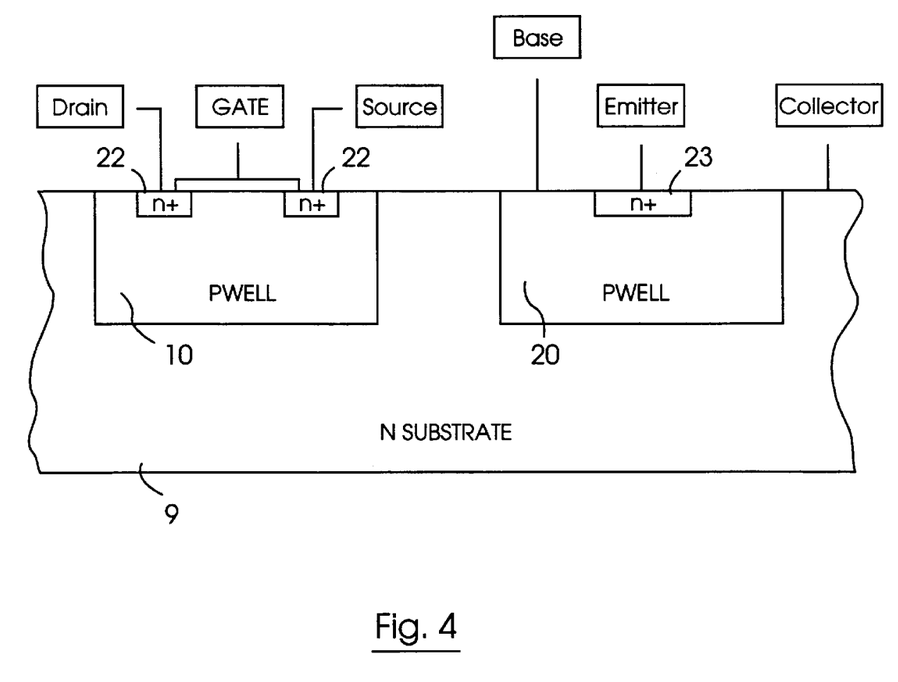
FIG. 4 is a block representation illustrating the connection of a pair of high swing interface output stage integrated circuits of FIG. 2 connected to a differential load resistor.

The circuit 1 comprises a substrate NPN bipolar junction transistor Q1 which is formed in an Nsubstrate 9 of the integrated circuit 1, see FIG. 4. The NPN bipolar junction transistor Q1 couples the output terminal 4 to the first rail 2 for pulling the voltage on the output terminal 4 to its high state towards the supply voltage $V_{dd}$ when the circuit is powered up and active.

Three NMOS field effect transistors, namely, a first FET MN1, a second FET MN2 and a third FET MN3 are simultaneously formed in the same well forming process in respective Pwells 10, only one of which is illustrated in FIG. 4 in the Nsubstrate 9. The first and second FETS MN1 and MN2 are coupled in series between the output terminal 4 and the second rail 3 for pulling the output terminal 4 to its low state towards ground when the circuit 1 is powered up and active. The second input signal is applied to the gate of the first FET MN1 through an inverter 14 which holds the first FET MN1 on when the first input signal is in its low state.

A first switch means, namely, a fourth FET, in this case a PMOS FET MP1 couples the gate of the second FET MN2 to the first rail 3 for holding the second FET MN2 on while the circuit 1 is powered up and active. The third input signal is applied to the gate of the fourth FET MP1 for holding the fourth FET MP1 on while the third signal is in its low state.

The third FET MN3 is connected between the common connection of the first and second FETS MN1 and MN2 and the gate of the second FET MN2 for holding the second FET MN2 off when the voltage on the output terminal 4 is driven below ground. As the output terminal voltage goes below the voltage on the second rail 3, the drain and source of the first and second FETS MN1 and MN2 are reversed. Thus, by holding the gate voltage on the second FET MN2 at the same voltage as the voltage at the common connection of the three FETS MN1, MN2 and MN3, the gate/source voltage $V_{gs}$ of the second FET MN2 is held at 0 volts, thereby turning off the second FET MN2. The third input signal is applied to the gate of the third FET MN3 which is turned on when the third input signal is in its high state.

The common connection of the first, second and third FETS MN1, MN2 and MN3 is connected to their respective Pwells so that when the voltage on the output terminal 4 is driven to a level equivalent to a diode drop voltage, approximately 0.7 volts below ground, the Pwell voltage of the first, second and third FETS MN1, MN2 and MN3 is pulled down with the output terminal voltage through the drain to Pwell parasitic diode DN1 of the first FET MN1, which is forward biased. This reverse biases the parasitic source to well diodes DN2 and DN3 of the second and third FETS MN2 and MN3, thus preventing current flow from ground through the parasitic diode DN1 of the first FET MN1, which overcomes the problem of the prior art interface circuit of FIG. 1.

Under certain operating conditions which are discussed in detail below, the first and second FETS MN1 and MN2 may be held on simultaneously when the voltage of the Pwells of the first, second and third FETS MN1, MN2 and MN3 is pulled below ground by the output terminal being driven to a voltage more than a diode drop, approximately 0.7 volts, below ground. This could cause excessive current flow from the second rail 2 to the output terminal 4. To avoid this a monitoring means, namely, a comparator 16 monitors the voltage on the output terminal 4, so that before the output terminal voltage reaches a diode drop voltage below ground, the comparator 16 pulls the enabling terminal ENB high, thus, applying a high signal to the gate of the third FET MN3, thereby turning on the third FET MN3 and turning off the fourth FET MP1. As already described, since in this condition the source and drain of the second FET MN2 will have reversed, by turning on the third FET MN3 the gate source voltage $V_{gs}$ of the second FET MN2 is held at 0 volts, which thus turns off the second FET MN2. Once the second FET MN2 is turned off the circuit presents a high impedance between the output terminal 4 and the second rail 3. The comparator 16 is supplied with a reference voltage $V_{ref}$ with which the voltage on the output terminal 4 is compared. The Voltage $V_{ref}$ is less than a diode drop voltage below ground. The output signal from the comparator 16 and the third input signal are gated to the enabling terminal ENB (although this is not illustrated) so that the appropriate one of the comparator output signal and the third input signal is applied to the enabling terminal ENB.

The base voltage on the bipolar transistor Q1 is controlled through a second switch means, namely, a fifth FET, in this case a PMOS FET MP2, and a third switch means, namely, sixth, seventh and eighth FETS, in this case NMOS FETS MN4, MN5 and MN6, respectively. The sixth, seventh and eighth FETS MN4, MN5 and MN6 are simultaneously formed in corresponding Pwells (not shown but similar to the Pwell 10) in the same diffusion Pwell forming process as the first, second and third FETS MN1, MN2 and MN3. The construction and connection of the sixth, seventh and eighth NMOS FETS MN4, MN5 and MN6 is similar to the construction of the first, second and third FETS MN1, MN2 and MN3.

The fifth FET MP2 pulls the base of the transistor Q1 towards the supply voltage $V_{dd}$ in response to the first input signal being in its high state for switching on the transistor Q1. The first input signal is applied to the gate of the fifth FET MP2 through an inverter 15. The base of the transistor Q1 is pulled towards ground through the sixth and seventh FETS MN4 and MN5 in response to the first input signal being in its low state for switching off the transistor Q1. The first input signal is applied to the gate of the sixth FET MN4 through the inverter 15. A fourth switch means, namely, a ninth FET, in this case a PMOS FET MP3 holds the seventh FET MN5 on while the circuit is powered up and active. The third input signal is applied to the gate of the ninth FET MP3 which holds the ninth FET MP3 on when the third input signal is in its low state. The eighth FET MN6 couples the common connection of the sixth and seventh FETS MN4 and MN5 to the gate of the seventh FET MN5 for holding the seventh FET 5 off when the base of the transistor Q1 is pulled below ground as a result the voltage on the output terminal 4 being below ground. When the base voltage of the transistor Q1 is pulled below ground, the drain and source of the seventh FET MN5 are reversed, and thus by holding the common connection and the gate of the seventh FET MN5 at the same voltage, the gate source voltage $V_{gs}$ is 0, thereby holding the seventh FET MN5 off. The third input signal is applied to the gate of the eighth FET MN6 which holds the eighth FET MN6 on when the third input signal is in its high state. By connecting the common connection of the sixth, seventh and eighth FETS MN4, MN5 and MN6 to their Pwells, their Pwell voltage is pulled down with the base voltage of the transistor Q1 in similar fashion and for similar reasons as already described for the first, second and third FETS MN1, MN2 and MN3.

The bipolar junction transistor Q1 blocks current flow between the first rail 2 and the output terminal 4 in the event of the voltage on the output terminal 4 being driven above the voltage on the first rail 2, when the circuit 1 is powered down or powered up and active or inactive, thus presenting a high impedance between the first rail 2 and the output terminal 4. The bipolar junction transistor Q1 also blocks current flow between the first rail 2 and the output terminal 4, and thus presents a high impedance between the first rail 2 and the output terminal 4, in the event of the voltage on the output terminal 4 being driven below the voltage on the second rail 3, when the circuit 1 is powered down or powered up and active or inactive, with the exception of one condition, that is when the circuit is powered up, active and the first and second input signals are in their high state. In that latter condition the fifth FET MP2 operates in its saturated condition, and the current flowing through the fifth FET MP2 is multiplied by the beta of the transistor Q1, as will be described below, thus a current limiting impedance is presented between the first rail 2 and the output terminal 4.

When the circuit 1 is powered down or powered up and active or inactive in the event of the voltage on the output terminal 4 being driven below ground when the first FET MN1 is on, the second FET MN2 is held off, thereby presenting a high impedance to the output terminal 4. Additionally, when the circuit 1 is powered down or powered up active or inactive with the first and second input signals being in their high states, in the event of the output terminal 4 being driven above the voltage on the first rail 2, the first FET MN1 is off, and thus presents a high impedance to the output terminal 4. When the circuit 1 is powered up and active, and the first and second input signals are in their low state, in the event of the output terminal 4 being driven above the voltage on the first rail 2, although the first and second FETS MN1 and MN2 are on, the current flow from the output terminal 4 to ground is limited by the saturation current of the first FET MN1, and thus, the first FET MN1 provides a limited current impedance to the output terminal 4. This is described in more detail below.

By virtue of the fact that the bipolar junction transistor Q1 is an NPN transistor and the substrate 9 is an Nsubstrate, the bipolar junction transistor Q1 can be formed as a substrate transistor, and additionally, can be formed in the same diffusion process steps in which the NMOS FETS are formed, see FIG. 4. In other words, the transistor Q1 and the first, second and third FETS MN1, MN2 and MN3, as well as the sixth, seventh and eighth FETS MN4, MN5 and MN6 are all simultaneously formed in the same diffusion process steps. Thus, fabrication of the circuit 1 is significantly simplified and the number of process steps significantly reduced. The Pwells 10 of the NMOS FETS and a Pwell 20 which forms the base of the transistor Q1 are simultaneously formed in the same P diffusion process. An N+diffusion process simultaneously forms the N+regions 22 which form the drain and source of the NMOS FETS, and the N+emitter region 23 of the transistor Q1. The Nsubstrate forms the collector of the transistor Q1. Additionally, the Nsubstrate forms the Nwells (not shown) of the PMOS FETS MP1, MP2 and MP3, and the source and drain of the PMOS FETS are formed by a P+diffusion process, thus further minimising the process steps in the fabrication of the circuit.

The process for forming the NPN transistor Q1, the NMOS FETS and the PMOS FETS is chosen so that the breakdown voltage of the NMOS and PMOS exceeds the extremes of the voltages which would result from the extremes of the bus terminal voltage and the supply voltage of the circuit. In this case the breakdown voltage is greater than at least 12 volts to comply with the requirements of the RS485 transmission standard. Accordingly, the avalanche and punchthrough breakdown of the N+ to Pwell junctions of the NMOS devices is greater than the extreme of the bus common mode voltage. Since the base/emitter junction of the transistor Q1 is formed by the same N+ and Pwell diffusions as the NMOS FETS, the transistor Q1 base/ emitter breakdown/punchthrough voltage will thus also be greater than the extremes of the bus common mode voltage.

When it is desired to interface a device with an RS485 bus, or any other bus which requires a differential output voltage to be provided, a pair of the circuits 1, namely, circuits 1A and 1B, are connected to the differential load resistor R1 as illustrated in FIG. 3. The data signal from which the first, second and third input signals are derived are fed into the circuit 1A on the line 17, and is fed into the circuit 1B on the line 18 through an inverter 19. Thus, the first, second and third input signals which are applied to the respective input terminals IN1 and IN2 and the enable terminal ENB of the circuit 1B are the inverse of the corresponding first, second and third input signals which are applied to the input terminals IN1 and IN2 and the enable terminal ENB of the circuit 1A, when the respective circuits 1A and 1B are powered and active and the output voltages on the respective output terminals 4 are being determined by the circuits 1A and 1B, when the output terminal 4 of the second 1A is in its high state, and the output terminal 4 of the circuit 1B is in its low state, current flow through the differential load resistor 4 flows from the first rail 2 of the circuit 1A through the transistor Q1 of the circuit 1A and in turn through the first and second FETS MN1 and MN2 of the circuit 1B to the second rail 3 of the circuit 1B, and vice versa when the high and low states of the terminals 4 of the circuits 1A and 1B are reversed.

The circuits 1A and 1B are capable of developing a voltage of at least 1.5 volts and higher across the differential resistor R1 for a supply voltage $V_{dd}$ of 3 volts or lower. Thereby, the circuits 1 have an output swing range of at least 1.5 volts. The maximum voltage which can be developed across the differential load resistor R1 is determined by:

(a) the value of the supply voltage $V_{dd}$, (b) the on resistance of the first and second FETS MN1 and MN2, (c) the base emitter voltage $V_{be}$ of the transistor Q1, and (d) the on resistance of the fifth FET MP2.

The on resistances of the first and second FETS MN1 and MN2 and the fifth FET MP2 are small, and thus, the voltage drop across these FETS is minimal. The base emitter voltage of the transistor Q1 is approximately 0.7 volts. Accordingly, when the supply voltage $V_{dd}$ is at 3 volts, the effective voltage applied to the output terminals 4 of the circuits 1 through the transistors Q1 is 2.3 volts. This, thus leaves sufficient head room to achieve a voltage of 1.5 volts across the differential load resistor R1 while at the same time allowing for the first and second FETS MN1 and MN2 and the fifth FET MP1 to be of realistic sizes.

Figure 5:
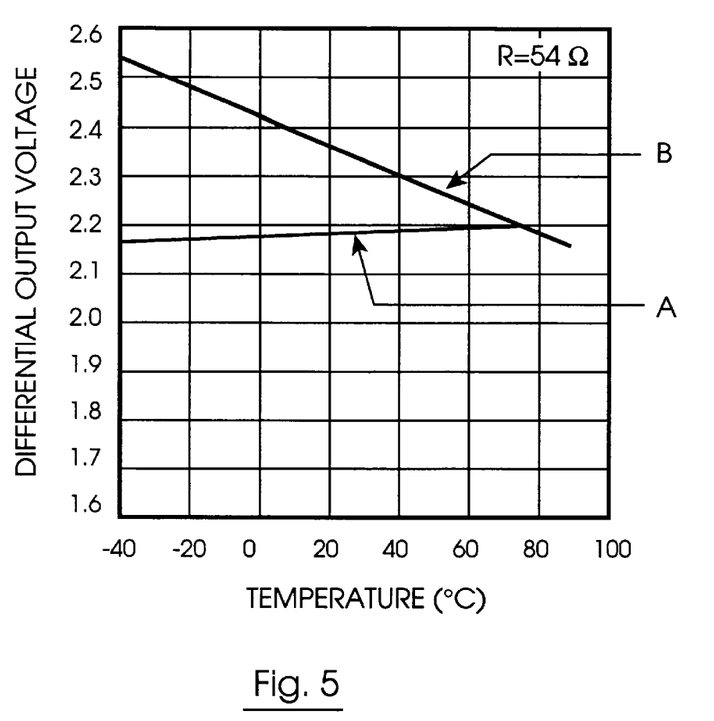
FIG. 5 is a graph comparing the temperature stability of the integrated circuit of FIG. 2 with that of a prior art circuit.

Additionally, the interface circuit 1 is temperature stable, and temperature independent over a relatively wide range of temperatures. The bipolar junction transistor Q1 has a negative temperature coefficient, and the temperature coefficient of the on resistance of the first and second FETS MN1 and MN2 is positive. Thus, the combined effect of the respective temperature coefficient of the bipolar junction transistor Q1 on the one hand, and the first and second FETS MN1 and MN2 on the other hand is to provide a temperature stable circuit. In particular, the differential output voltage developed by the circuit 1 across the differential load resistor R1 is virtually constant within a relatively wide range of temperatures. Graph A in FIG. 5 illustrates a plot of the differential output voltage developed by the circuits 1 across the differential load resistor R1 of 54 ohms against temperature. In this case, the supply voltage $V_{dd}$ is approximately 3 volts. As can be seen, the differential output voltage is just below 2.2 volts over the temperature range of −40° C. to 80° C. By way of comparison, the differential output voltage which was derived in a test carried out under similar conditions on the interface output stage integrated circuit of prior art U.S. Pat. No. 5,414,314 is illustrated by Graph B in FIG. 5. The differential load resistor R1 was 54 ohms and the supply voltage $V_{dd}$ was 3 volts. As can be seen, the differential output voltage developed by the prior art circuit drops off from a value of just above 2.5 to below 2.2 in the same temperature range from −40° C. to 80° C. Accordingly, by virtue of the fact that the circuit 1 is relatively temperature stable, the PMOS and NMOS FETS can be of smaller size than those of prior art devices to cope with a similar relatively wide temperature range.

The eight main conditions under which the circuit 1 may have to operate are set out in Table 1, and discussed in detail below.

TABLE 1

Operating conditions of the circuit 1

| | | | |
|---|---|---|---|
| (1) | $V_{dd}$ applied, disabled | | output terminal circuit voltage above $V_{dd}$ |
| (2) | $V_{dd}$ applied, circuit disabled | | output terminal voltage below ground |
| (3) | $V_{dd}$ = 0 volts | | output terminal voltage above $V_{dd}$ |
| (4) | $V_{dd}$ = 0 volts | | output terminal voltage below ground |
| (5) | $V_{dd}$ applied, enabled | IN1/IN2 = 1 | output terminal circuit voltage above $V_{dd}$ |
| (6) | $V_{dd}$ applied, enabled | IN1/IN2 = 1 | output terminal circuit voltage below ground |
| (7) | $V_{dd}$ applied, enabled | IN1/IN2 = 0 | output terminal circuit voltage above $V_{dd}$ |
| (8) | $V_{dd}$ applied, enabled | IN1/IN2 = 0 | output terminal circuit voltage below ground |

Condition 1

In condition 1 the supply voltage $V_{dd}$ is applied to the circuit 1, the circuit 1 is disabled by the first input signal being low and the second and third input signals being high. The voltage on the output terminal 4 is being driven above the supply voltage $V_{dd}$. The transistor Q1 and the first and second FETS MN1 and MN2 are off. Accordingly, no current can flow from the output terminal 4 to the positive supply rail 2, since the base/emitter of transistor Q1 blocks against current flowing into the output terminal 4. Since the first FET MN1 is also off no current can flow from the output terminal 4 to the ground supply rail 3.

Accordingly, when the circuit 1 is operating under condition 1 the circuit provides a high impedance to the output terminal 4 as the voltage on the output terminal 4 is driven above the supply voltage $V_{dd}$ on the first rail 2.

Condition 2

In condition 2 the supply voltage $V_{dd}$ is applied to the circuit 1, the circuit 1 is disabled as in condition 1, and the voltage on the output terminal 4 is being driven below ground voltage on the second rail 3. As the voltage on the output terminal 4 is driven to a voltage which is more than a diode drop voltage below ground, the voltage on the output terminal 4 pulls the Pwell voltage of the first, second and third FETS MN1, MN2 and MN3 with it through the drain to Pwell parasitic diode DN1 of the first FET MN1, and thus the Pwell voltage is a diode drop, approximately 0.7 volts above the voltage on the output terminal 4. The high state of the third input signal on the enabling terminal ENB holds the third FET MN3 on, thereby ensuring that the gate source voltage $V_{gs}$ of the second FET MN2 is 0. At this stage the source and drain of the second FET MN2 has reversed. Accordingly, no current can flow from the ground rail 3 through the second FET MN2, and in turn through the first FET MN1 to the output terminal 4 or its parasitic diode DN1. Additionally, as the well of the second FET MN2 is pulled below ground no current can flow through the source to well parasitic diode DN2, of the second FET MN2, since the diode DN2 is reversed biased, and will only break down when the magnitude of voltage is greater or less than the minimum voltages expected on the data bus. Furthermore, no current can flow through the third FET MN3 since the fourth FET MP1 is off and the source to well parasitic diode DN3 of the third FET MN3 is also reversed biased.

Additionally, as the output terminal 4 is driven below ground the base emitter junction of the transistor Q1 is forward biased and pulls the drains of the fifth FET MP2 and the sixth FET MN4 down with it, and thus the drains of the fifth and sixth FETS MP2 and MN4 are thus at a voltage of $V_{ve}$, namely, the base emitter voltage of the transistor Q1, above that of the output terminal 4. Since the fifth FET MP2 is off no current can flow into the base of the transistor Q1 provided the breakdown voltage of the fifth FET MP2 is greater than the value of the difference in voltage between the supply voltage $V_{dd}$ and the voltage to which the output terminal 4 has been driven below ground, as in this case. Since the sixth, seventh and eighth FETS MN4, MN5 and MN6 form a similar structure to the structure of the first, second and third FETS MN1, MN2 and MN3 no current will flow into the base of the transistor Q1 through the sixth and seventh FETS MN4 and MN5 or through their respective parasitic diodes DN4 and DN5, for the same reason as already discussed in connection with the first, second and third FETS MN1, MN2 and MN3.

Accordingly, when the circuit 1 is operating under condition 2, the circuit provides a high impedance to the output terminal 4 as the voltage of the output terminal 4 is driven below the ground voltage on the second rail 3.

Condition 3

In condition 3 the circuit 1 is not powered up and thus the supply voltage $V_{dd}$ is 0, the circuit 1 is thus disabled. The voltage on the output terminal 4 is being driven above the 0 volts on the first rail 2. As the voltage on the output terminal 4 is driven above the supply 0 volt on the first rail 2, the emitter/base junction of the transistor Q1 is reverse biased, and thus prevents current flow into the output terminal 4 through the transistor Q1. Since no power is applied to the circuit 1 the first FET MN1 is off, and thus, blocks current flow into the output terminal 4 through the first FET MN1.

Accordingly, when the circuit 1 is operating under condition 3 the circuit provides a high impedance to the output terminal 4 as the voltage on the output terminal 4 is driven above the zero supply voltage on the first rail 3.

Condition 4

In condition 4 the circuit 1 is not powered up, and thus, the supply voltage $V_{dd}$ is 0, the circuit 1 is disabled, and the voltage on the output terminal 4 is being driven below the ground voltage on the ground rail 3. When the voltage on the output terminal 4 reaches the equivalent of a diode drop voltage, approximately 0.7 volts below ground the voltage of the Pwells of the first, second and third FETS MN1, MN2 and MN3 is pulled down with the output terminal voltage through the parasitic drain to well diode DN1 of the first FET MN1 which is forward biased. Current flow through the second FET MN2 is prevented by virtue of the fact that the gates of both the second and third FETS MN2 and MN3 are at 0 volts, since no voltage is applied to the circuit 1. However, as the gate source voltage $V_{gs}$ of the second FET MN2 increases the gate source voltage of the third FET MN3 also increases. This turns on the third FET MN3, which in turn holds the gate source voltage $V_{gs}$ of the second FET MN2 at 0. This as discussed before prevents current flow out of the output terminal 4 through the first and second FETS MN1 and MN2. Since no voltage is applied to the circuit 1, the fourth FET MP1 cannot be turned on, so additionally, there is no source of current from the fourth FET MP1 through the third FET MN3 or the forward biased drain to well parasitic diode DN1 of the first FET MN1.

Additionally, as the output terminal 4 is driven below ground the forward biased emitter/base junction of the transistor Q1 also pulls the base of the transistor Q1 negative. As discussed above the sixth, seventh and eighth FETS MN4, MN5 and MN6 form a similar structure to that of the first, second and third FETS MN1, MN2 and MN3, and thus, there is no current flow into the base of the transistor Q1 from the drain of the sixth FET MN4. Additionally, no current can flow into the base of the transistor Q1 from the fifth FET MP2 since the supply voltage is 0 volts, and thus the fifth FET MP2 cannot turn on. With no collector to base current for the transistor Q1, the transistor Q1 cannot provide current to the output terminal 4.

Accordingly, when the circuit 1 is operating under condition 4, the circuit provides a high impedance to the output terminal 4 as the voltage on the output terminal 4 is driven below the ground voltage on the second rail 3.

Condition 5

In condition 5 the supply voltage $V_{dd}$ is applied to the circuit 1, the circuit 1 is enabled, the first and second input signals on the input terminals IN1 and IN2 are in their high state and the third input signal on the enabling terminal ENB is in its low state. The voltage on the output terminal 4 is being driven above the supply voltage $V_{dd}$. The transistor Q1 is on and the first FET MN1 is off. As the voltage on the output terminal 4 is driven above $V_{dd}$ the reverse biased base emitter junction of the transistor Q1 blocks current flow from the output terminal 4 to the first rail 2. The first FET MN1 blocks current flow between the output terminal 4 and the ground rail 3.

Accordingly, when the circuit 1 is operating under condition 5, the circuit provides a high impedance to the output terminal 4 as the voltage on the output terminal 4 is driven above the supply voltage $V_{dd}$ on the first rail 2.

Condition 6

In this condition the supply voltage $V_{dd}$ is applied to the circuit 1, the circuit is enabled as in condition 5, the first and second input signals on the input terminals IN1 and IN2 are in their high states, and the third input signal on the enabling terminal ENB is in its low state. The voltage on the output terminal 4 is being driven below the ground voltage on the second rail 3. Before the voltage on the output terminal 4 reaches ground, the transistor Q1 is on and the first FET MN1 is off. As the voltage on the output terminal 4 is driven below ground the current through the output terminal 4 is determined by the beta ratio of the transistor Q1, in other words, the ratio of the collector current to base current of the transistor Q1 and the saturation current of the fifth FET MP2. Accordingly, the transistor Q1 and the fifth FET MP2 present a limiting current impedance between the output terminal 4 and the first rail 2.

Since the first FET MN1 is off its gate voltage is 0. When the output terminal voltage reaches the equivalent of a diode drop below ground the Pwell voltage of the first, second and third FETS MN1, MN2 and MN3 is pulled down with the output terminal voltage through the drain to well parasitic diode DN1 of the first FET MN1, which is forward biased. Before the Pwell voltage of the first, second and third FETS MN1, MN2 and MN3 reaches the threshold voltage $V_t$ of the third FET MN3 below ground, the third FET MN3 is off and the second FET MN2 is on and operating in its non-saturated region, in other words, the second FET MN2 is resistive. The resistance of the second FET MN2 is low and thus if the second FET MN2 were allowed to continue conducting current the resulting component of current through the second FET MN2 and through the output terminal 4, when added to the component of current from the output terminal 4 through the transistor Q1 could be sufficiently high to result in failure of a short circuit current specification for some bus standards. However, the voltage on the output terminal 4 is monitored by the comparator 16, and before the voltage on the output terminal 4 reaches the equivalent of a diode drop below ground, the comparator 16 pulls the enable terminal ENB high for switching the third FET MN3 on, thereby holding the gate/source voltage $V_{gs}$ of the second FET MN2 at 0 volts, and ensuring no source of current to the output terminal 4, since the second FET MN2 will be held off.

The high on the enabling terminal ENB holds the fourth FET MP1 off thus, preventing a component of output terminal current from the fourth FET MP1 through the third FET MN3 and the parasitic diode DN1 of the first FET MN1. The high on the enabling terminal ENB prevents similar current flow from the sixth, seventh and eighth FETS MN4, MN5 and MN6 adding a component of base current to the transistor Q1, and hence, being beta multiplied into the total output terminal current.

Accordingly, when the circuit 1 is operating under condition 6 the circuit provides a current Limited impedance to the output terminal 4 as the voltage on the output terminal 4 is driven below the ground voltage on the second rail 3.

Condition 7

In condition 7 the supply voltage $V_{dd}$ is applied to the circuit 1, the circuit 1 is enabled, the first, second and third input signals on the input terminals IN1 and IN2 and the enabling terminal ENB, respectively, are in their low states, and the voltage on the output terminal 4 is being driven above the supply voltage $V_{dd}$ on the first rail 2. The first FET MN1 is on and the transistor Q1 is off. As the output terminal 4 is driven above $V_{dd}$ the reverse biased base emitter junction of the transistor Q1 prevents current flow through the transistor Q1 from the output terminal 4 to the first rail 2. A component of the current through the output terminal 4 flows through the first FET MN1, and this current is limited by the saturation current of the first FET MN1, thus presenting a current limited impedance to the output terminal 4.

Accordingly, in condition 7 the circuit presents a current limited impedance to the output terminal 4 as the voltage on the output terminal 4 is driven above the supply voltage $V_{dd}$ on the first rail 2.

Condition 8

In condition 8 the supply voltage $V_{dd}$ is applied to the circuit 1, the circuit 1 is enabled, the first, second and third input signals on the input terminals IN1 and IN2 and the enabling terminal ENB, respectively, are in their low states. The output terminal 4 is being driven below ground. No current can flow through the output terminal 4 until the output terminal voltage goes below ground, since there is no voltage drop across the first and second FETS MN1 and MN2 and since the transistor Q1 is off. As the output terminal voltage is driven below ground the first and second FETS MN1 and MN2 conduct current, which current is determined by the on resistance of the first and second FETS MN1 and MN2. However, the voltage on the output terminal 4 is monitored by the comparator 16, and before the voltage on the output terminal 4 reaches the equivalent of a diode drop voltage below ground, the comparator 16 pulls the enabling terminal ENB high, thereby switching on the third FET MN3, which holds the second FET MN2 off, thereby preventing current flow to the output terminal 4. The high on the enabling terminal ENB switches off the second and fourth FETS MN2 and MP1 as already describe in condition 6. This thus prevents any current flow through the output terminal 4. Similarly, current from the sixth, seventh and eighth FETS MN4, MN5 and MN6 into the transistor Q1 is also prevented when the base of the transistor Q1 is pulled below ground through the forward biased base/emitter junction of the transistor Q1.

Accordingly, in condition 8 the circuit 1 presents a high impedance to the output terminal 4 as the voltage on the output terminal 4 is driven below the ground voltage on the second rail 3.

While the circuit 1 has been described as comprising a NPN transistor Q1 and first, second third, and sixth, seventh and eighth NMOS FETS, it will be appreciated that the transistor Q1 may be provided by a PNP transistor. In which case, the first, second third, and sixth, seventh and eighth FETS would be PMOS FETS. The PNP transistor and the PMOS FETS would likewise be formed by the same Nwell process. However, in such a case, the PNP transistor would be coupled between the output terminal 4 and the ground supply rail, while the first and second PMOS FETS would be coupled between the output terminal 4 and the positive supply rail. The rest of the circuit would likewise be reversed, and the PMOS FETS in the circuit already described with reference to FIGS. 2 to 4 would be replaced by NMOS FETS. Additionally, the circuit would be fabricated on a Psubstrate, and the base of the PNP transistor and the Nwells of the PMOS FETS would be formed simultaneously in the same diffusion process. The Psubstrate would form the Pwells of the NMOS FETS.

While the circuit 1 has been described in general for developing a differential voltage across a differential load resistor where two interface circuits are required, it will be readily apparent to those skilled in the art that a single interface circuit may be provided for interfacing a device to a data bus, in which case, a voltage would be developed across a load resistor connected to a common ground of the data bus, or otherwise.

I claim:

1. A high swing interface output stage integrated circuit for interfacing a device with a data bus, the circuit comprising:

a bipolar junction transistor coupled between a first supply rail and an output terminal of the circuit, first, second and third field effect transistors of Pwell or Nwell type corresponding to the P or N type of the base of the bipolar junction transistor, respectively, the first and second field effect transistors being coupled in series between the output terminal and a second supply rail of the circuit, the second field effect transistor being coupled to the second supply rail, the third field effect transistor being coupled between the common connection of the first and second field effect transistors and the gate of the second field effect transistor for holding the second field effect transistor off when the polarity of the voltage across the source and drain of the second field effect transistor is reversed from that normally established by voltages sourced to the first and second supply rails, the common connection of the first, second and third field effect transistors being connected to the well or wells of the respective first, second and third field effect transistors, and a control means for controlling the third field effect transistor for holding the second field effect transistor on when the circuit is powered up and active so that the bipolar junction transistor and the first field effect transistor can be controlled for determining the high and low states of the output terminal, and for controlling the third field effect transistor, when the circuit as powered down or powered up and active or inactive, for holding the second field effect transistor off to present a high impedance between the output terminal and the second supply rail in response to the voltage on the output terminal being driven outside supply voltages presented on the first and second rails in the direction of the second rail, the bipolar junction transistor, the first and second field effect transistors and the control circuit being adapted so that when the circuit is powered up and active the bipolar junction transistor forms one of a high impedance or a current limiting impedance between the output terminal and the first supply rail when the voltage on the output terminal is driven outside the supply voltage on the first and second rails in the direction of the second rail, and the first field effect transistor forms a current limiting impedance between the output terminal and the second supply rail when the voltage on the output terminal is driven outside the supply voltage on the first and second rails in the direction of the first rail.

2. A circuit as claimed in claim 1 in which the control means selectively holds the bipolar junction transistor on in response to a first input signal being in one of high and low states.

3. A circuit as claimed in claim 2 in which the control means selectively holds the first field effect transistor on in response to a second input signal being in one of high and low states.

4. A circuit as claimed in claim 3 in which the control means selectively holds one of the bipolar junction transistor and the first field effect transistor on, and the other off in response to the first and second input signals being in the same one of the high and low states for determining one of the high and low states of the output terminal when the circuit is powered up and active.

5. A circuit as claimed in claim 1 in which the third field effect transistor is responsive to a third input signal being in one of high and low states for holding the third field effect transistor on for in turn holding the second field effect transistor off.

6. A circuit as claimed in claim 5 in which the control means comprises a first switch means coupled between the first rail and the gate of the second field effect transistor, the first switch means being responsive to the third input signal for holding the first switch means on for in turn holding the second field effect transistor on, when the third input signal is in the one of the high and low states for holding the third field effect transistor off.

7. A circuit as claimed in claim 6 in which the first switch means comprises a fourth field effect transistor of Pwell or Nwell type different from the P or N type of the base of the bipolar junction transistor, respectively the third input signal being applied to the gate of the fourth field effect transistor.

8. A circuit as claimed in claim 5 in which the control means comprises a second switch means for coupling the base of the bipolar junction transistor to the first rail, and a third switch means for coupling the base of the bipolar junction transistor to the second rail, the second and the third switch means being responsive to the first input signal for selectively holding the bipolar junction transistor on and off in response to the respective states of the first input signal, the third switch means being responsive to the third input signal for holding the bipolar junction transistor off when the third input signal is in the one of the high and low states for holding the third field effect transistor off, the second switch means being adapted for providing a current limiting impedance in the event of the second switch means and the bipolar junction transistor being on when the voltage on the output terminal is driven outside the supply voltage in the direction of the second rail.

9. A circuit as claimed in claim 8 in which the second switch means comprises a fifth field effect transistor of Pwell or Nwell type different from the P or N type of the base of the bipolar junction transistor, respectively the fifth field effect transistor being responsive to one of the high and low states of the first input signal for connecting the base of the bipolar junction transistor to the first rail for holding the bipolar junction transistor on.

10. A circuit as claimed in claim 8 in which the third switch means comprises sixth, seventh and eighth field effect transistors of a Pwell or Nwell type corresponding to that of the P or N type of the base of the bipolar junction transistor, respectively the sixth and seventh field effect transistors being coupled in series between the base of the bipolar junction transistor and the second rail, the seventh field effect transistor being coupled to the second rail, the eighth field effect transistor being coupled between the common connection of the sixth and seventh field effect transistors, and the gate of the seventh field effect transistor for holding the seventh field effect transistor off when the polarity of the voltage across the source and drain of the seventh transistor are reversed from that normally established by voltages sourced through the first and second supply rails to establish a supply voltage range by the voltage on the base of the bipolar junction transistor being pulled outside the supply voltage range in the direction of the second rail, the common connection of the sixth, seventh and eighth field effect transistors being connected to the well or wells of the respective sixth, seventh and eighth field effect transistors, the sixth field effect transistor being responsive to one of the high and low states of the first input signal for connecting the base of the bipolar junction transistor to the second rail when the seventh field effect transistor is held on for holding the bipolar junction transistor off.

11. A circuit as claimed in claim 10 in which the eighth field effect transistor is responsive to the third input signal for holding the seventh field effect transistor off, when the third input signal is in the one of the high and low states for holding the third field effect transistor on.

12. A circuit as claimed in claim 10 in which the control means comprises a fourth switch means coupled between the first rail and the gate of the seventh field effect transistor for holding the seventh field effect transistor on when the circuit is powered up and active, the fourth switch means being responsive to the third input signal for holding the seventh field effect transistor on, when the third input signal is in the one of the high and low states for holding the third field effect transistor off.

13. A circuit as claimed in claim 12 in which the fourth switch means comprises a ninth field effect transistor of Pwell or Nwell type different to the P or N type of the base of the bipolar junction transistor, the third input signal being applied to the gate of the ninth field effect transistor.

14. A circuit as claimed in claim 1 in which the control means comprises a monitoring means for monitoring the voltage on the output terminal, the control means being responsive to the monitoring means for operating the third field effect transistor for holding the second field effect transistor off before the voltage on the output terminal is driven outside the supply voltage in the direction of the second rail to a level which would turn on a drain to well parasitic diode of the first or second field effect transistors.

15. A circuit as claimed in claim 1 in which the bipolar junction transistor is a substrate transistor, the collector of which is formed by the substrate.

16. A circuit as claimed in claim 7 in which the base of the bipolar junction transistor is formed by the integrated circuit substrate and the well of each field effect transistor is of a semiconductor type opposite to that of the substrate.

17. A circuit as claimed in claim 1 in which the bipolar junction transistor is an NPN transistor, and the first rail is at a voltage higher than the voltage on the second rail.

18. A circuit as claimed in claim 1 in which the bipolar junction transistor and the field effect transistors which are of the same Pwell or Nwell type as the P or N type of the base of the bipolar junction transistor are formed simultaneously during the same Pwell or Nwell well diffusion process.

19. A circuit as claimed in claim 1 in which the breakdown voltage of the field effect transistors of the integrated circuit is chosen to exceed the extremes of the voltages across their source and drain path which would result when the output terminal voltage to which the circuit is to be connected reaches its expected extremes.

20. A device for communicating a data communications device with a data bus, the device comprising the high swing interface output stage integrated circuit as claimed in claim 1.

21. A method for providing a high swing interface output stage integrated circuit for interfacing a device with a data bus, wherein other devices on the data bus may operate at supply voltages outside the supply voltage of the interface circuit, the method comprising the steps of providing a bipolar junction transistor coupled between a first supply rail and an output terminal of the circuit, providing first, second and third field effect transistors of Pwell or Nwell type corresponding to the P or N type of the base of the bipolar junction transistor, respectively, the first and second field effect transistors being coupled in series between the output terminal and a second supply rail of the circuit, the second field effect transistor being coupled to the second supply rail, the third field effect transistor being coupled between the common connection of the first and second field effect transistors and the gate of the second field effect transistor for holding the second field effect transistor off when the polarity of the voltage across the source and drain of the second field effect transistor is reversed from that normally established by voltages sourced to the first and second supply rails, the common connection of the first, second and third field effect transistors being connected to the well or wells of the respective first, second and third field effect transistors, and controlling the third field effect transistor for holding the second field effect transistor on when the circuit is powered up and active so that the bipolar junction transistor and the first field effect transistor can be controlled for determining the high and low states of the output terminal, and for controlling the third field effect transistor, when the circuit is powered down or powered up and active or inactive for holding the second field effect transistor off to present a high impedance between the output terminal and the second supply rail in response to the voltage on the output terminal being driven outside supply voltages presented on the first and second rails in the direction of the second rail, and adapting the bipolar junction transistor, the first and second field effect transistors and the control circuit so that when the circuit is powered up and active the bipolar junction transistor forms one of a high impedance or a current limiting impedance between the output terminal and the first supply rail when the voltage on the output terminal is driven outside the supply voltage on the first and second rails in the direction of the second rail, and so that the first field effect transistor forms a current limiting impedance between the output terminal and the second supply rail when the voltage on the output terminal is driven outside the supply voltage on the first and second rails in the direction of the first rail.

* * * * *